(12) United States Patent
Özyilmaz et al.

(10) Patent No.: US 9,082,523 B2
(45) Date of Patent: Jul. 14, 2015

(54) TRANSPARENT CONDUCTOR

(75) Inventors: Barbaros Özyilmaz, Singapore (SG); Guang Xin Ni, Singapore (SG); Yi Zheng, Singapore (SG)

(73) Assignee: NATIONAL UNIVERSITY OF SINGAPORE, SINGAPORE (SG)

( * ) Notice: Subject to any disclaimer, the term of this patent is extended or adjusted under 35 U.S.C. 154(b) by 0 days.

(21) Appl. No.: 13/882,451

(22) PCT Filed: Nov. 10, 2011

(86) PCT No.: PCT/SG2011/000399
§ 371 (c)(1),
(2), (4) Date: Apr. 29, 2013

(87) PCT Pub. No.: WO2012/064285
PCT Pub. Date: May 18, 2012

(65) Prior Publication Data
US 2014/0193626 A1    Jul. 10, 2014

Related U.S. Application Data

(60) Provisional application No. 61/411,971, filed on Nov. 10, 2010.

(51) Int. Cl.
| | |
|---|---|
| B32B 9/00 | (2006.01) |
| H01B 1/04 | (2006.01) |
| C01B 31/04 | (2006.01) |
| H01L 51/44 | (2006.01) |
| H01B 13/00 | (2006.01) |
| H01L 51/52 | (2006.01) |

(52) U.S. Cl.
CPC ............ H01B 1/04 (2013.01); C01B 31/0438 (2013.01); H01B 13/0033 (2013.01); H01L 51/442 (2013.01); *C01B 2204/00* (2013.01); *H01L 51/5206* (2013.01); *Y02E 10/549* (2013.01); *Y10T 428/2911* (2015.01); *Y10T 428/30* (2015.01)

(58) Field of Classification Search
CPC ...................... C01B 31/0438; B32B 2313/04
USPC .......................................... 428/408; 423/448
See application file for complete search history.

(56) References Cited

U.S. PATENT DOCUMENTS

| | | |
|---|---|---|
| 2009/0146111 A1 | 6/2009 | Shin et al. |
| 2010/0021708 A1 | 1/2010 | Kong et al. |
| 2010/0173134 A1 | 7/2010 | Khokhlov et al. |

(Continued)

FOREIGN PATENT DOCUMENTS

| | | |
|---|---|---|
| WO | 2010006080 A3 | 1/2010 |
| WO | 2010036210 A1 | 4/2010 |

(Continued)

OTHER PUBLICATIONS

Giovannetti, Substrate-induced band gap in graphene on hexagonal boron nitride: Ab initio density functional calculations, Physical Review B 76, 073103 (2007).*

(Continued)

*Primary Examiner* — Daniel H Miller

(57) ABSTRACT

A transparent conductor comprising: a graphene layer and a permanent dipole layer on the graphene layer configured to electrostatically dope the graphene layer.

18 Claims, 7 Drawing Sheets

(56) References Cited

U.S. PATENT DOCUMENTS

2010/0258786 A1* 10/2010 Wang et al. ............... 257/29
2011/0101309 A1* 5/2011 Lin et al. ............... 257/29

FOREIGN PATENT DOCUMENTS

WO    2010036210 A8    4/2010
WO    2012064285 A1    5/2012

OTHER PUBLICATIONS

Foreign Communication from a Related Counterpart Application, International Search Report and Written Opinion dated Apr. 5, 2012, International Application Serial No. PCT/SG2011/000399, filed on Nov. 10, 2011.

Foreign Communication from a Related Counterpart Application, International Preliminary Report on Patentability dated May 23, 2013, International Application PCT/US11/00399 filed on Nov. 10, 2011. 6pgs.

Foreign Communication from a Related Counterpart Application, Extended European Search Report dated Feb. 23, 2015, EP Application 11 83 9313.1, 12 pages.

Hong X, et al., High mobility multi-layer graphene field effect transistors fabricated on expitaxial ferroelectric gate oxides, Physical Review Letters, American Physical Society, US vol. 102, No. 13: 136808-1, Apr. 3, 2009.

Zheng X, et al., Gate-controlled non-volatile graphene-ferroelectric memory, Physical Review Letters, American Institute of Physics, US, vol. 94, No. 16; 163505-163505, Apr. 22, 2009.

Hong X, et al., Unusual resistance hysteresis in n-layer graphene field effect transistors fabricated on ferroelectric Pb $(Zr_{0.2}Ti_{0.8})O_3$, Applied Physics Letter, American Institute of Physics, US, vol. 97, No. 3: 33114-33114, Jul. 23, 2010.

Yong-Joo Doh, et al., Nonvolatile memory devices based on few-layer graphene films, Nanotechnology, IOP, Bristol, GB, vol. 21 No. 10: 105204, Mar. 12, 2010.

* cited by examiner

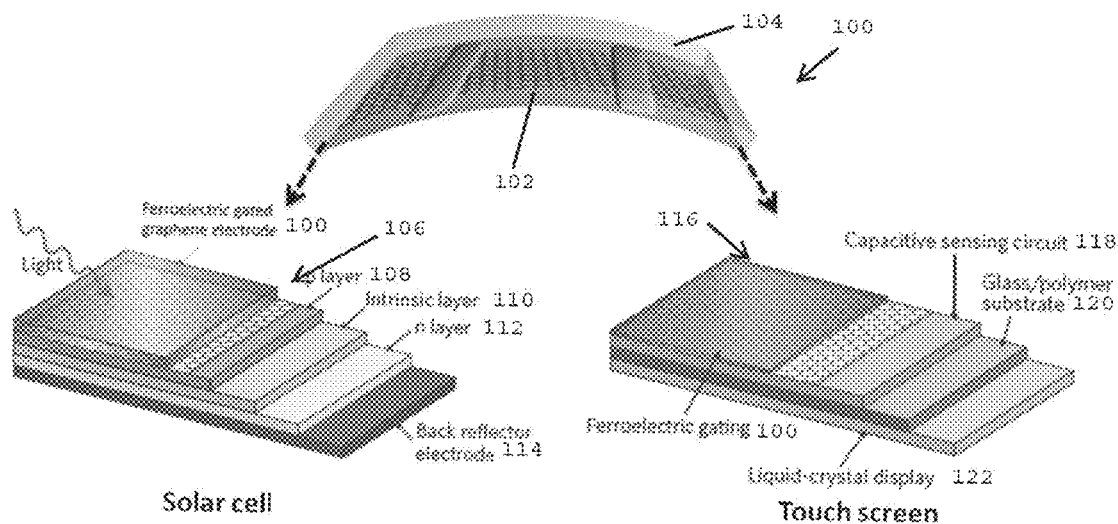
Figure 2(a) Solar cell
Figure 2(b) Touch screen
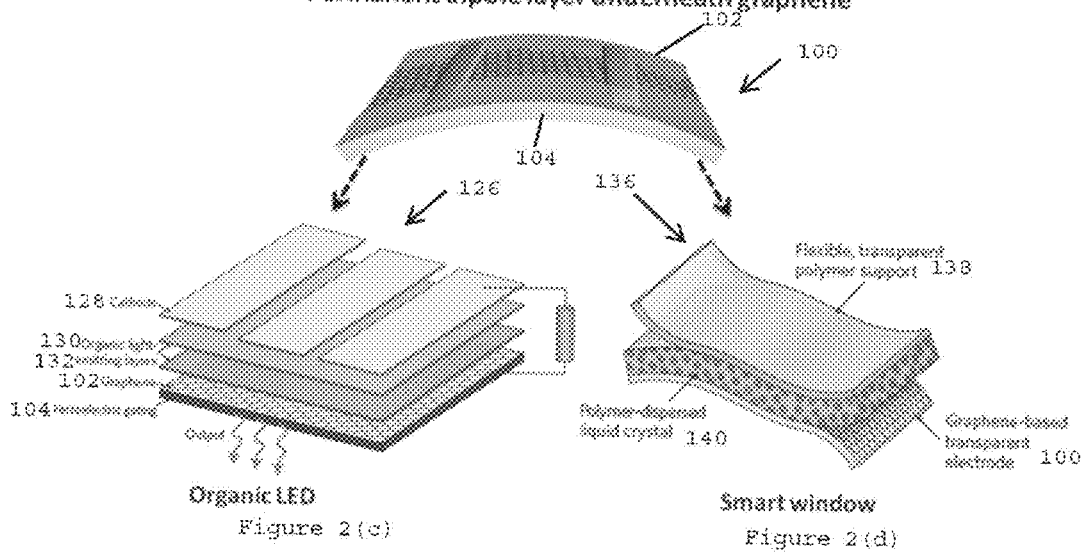
Figure 2(c) Organic LED
Figure 2(d) Smart window

TRANSPARENT CONDUCTOR

CROSS-REFERENCE TO RELATED APPLICATIONS

This application is a filing under 35 U.S.C. 371 as the National Stage of International Application No. PCT/SG2011/000399, filed Nov. 10, 2011, entitled "TRANSPARENT CONDUCTOR," which claims the benefit of and priority to U.S. Provisional Patent Application No. 61/411,971, filed Nov. 10, 2010 and entitled "TRANSPARENT CONDUCTOR", both of which are incorporated herein by reference in their entirety for all purposes.

FIELD

The present invention relates generally to a transparent conductor and methods of fabricating a transparent conductor. In particular, but not exclusively, the present invention relates to a graphene-permanent dipole layer hybrid structure based transparent conductor and methods of fabrication thereof.

BACKGROUND

Transparent conductors are used in high-performance displays, photovoltaic, touchscreens, organic light emitting diodes (OLED), smart windows and solar cells where high transparency and conductivity are required. The market for such transparent conductors may reach $5.6 billion by 2015.

Presently, ITO is the dominant transparent conductor, providing the best known combination of transparency (80%) and sheet resistance (10Ω/□). However, ITO has several crucial drawbacks. Namely:
- ITO is increasingly expensive due the scarcity of indium;
- ITO has limited environmental chemical stability and finite permeability which can lead to device degradation;
- ITO easily wears out or cracks when bending/compression is involved
- ITO is not flexible and such cannot be used in flexible displays, solar cells and touch panels The possible replacements of ITO include metal grids, metallic nanowires, metal oxides and nanotubes, while none of them provides performance as good as ITO.

Graphene is novel type of two-dimensional material arranged in a hexagonal honeycomb structure. As an atomic layer membrane, graphene is highly transparent (97.3%) over wide wavelengths ranging from visible to near infrared (IR). Owing to its covalent carbon-carbon bonding, graphene is also one of the stiffest materials with a remarkably high Young's modulus of ~1 TPa, yet stretchable and bendable at the same time, with a maximum stretchability of up 20%. The combination of its high transparency, wide-band optical tunability and excellent mechanical properties make graphene a very promising candidate for flexible electronics, optoelectronics and phonotics. The technical breakthrough of large-scale graphene synthesis has further accelerated the employment of graphene films as transparent electrodes.

To utilize graphene as transparent electrodes in optoelectronic devices such as solar cells, organic light emitting diodes, touch panels and displays, the key challenge is to reduce the sheet resistance to values comparable with indium tin oxide (ITO), which provides the best known combination of transparency (90%) and sheet resistance (<100Ω/□). To achieve ultralow sheet resistance, the typical prior art approach is by heavily doping graphene. This is because sheet resistance follows the Drude model as shown in the following:

$$Rs = \frac{1}{\sigma} = \frac{1}{ne\mu}$$

where n is charge carrier concentration, e is fundamental element charge of electrons and μ is charge carrier mobility in graphene. Charge mobility of graphene is roughly a constant, which depends on sample fabrication procedures. Thus, effectively increasing carrier density n will directly decrease the sheet resistance value of graphene.

Currently, chemical doping has been shown to effectively reduce the sheet resistance of graphene. Using nitric acid ($HNO_3$) doping, the lowest sheet resistance ~125Ω/□ with 97.4% transmittance in large-scale monolayer graphene has been achieved. However, the introduced chemical dopants are not stable over time and a protective coating or encapsulation steps are required. Furthermore, although the decreasing sheet resistance using chemical doping may be sufficient for touch panels, it may not work for many other applications such as solar cell, light emitting diodes and large-scale displays. Such other applications may need sub-10Ω/□ at transparencies larger than 90%.

SUMMARY

In general terms the present invention relates to a transparent conductor using wafer scale graphene non-volatile electrostatically doped by a permanent dipole layer. This may have advantages of graphene such as high optical transparency, mechanical flexibility and/or impermeability together with an ultra low sheet resistance.

In one specific expression of the invention there is provided a transparent conductor comprising a graphene layer, a permanent dipole layer on the graphene layer configured to electrostatically dope the graphene layer.

The permanent dipole layer may be a substantially polarised ferroelectric layer.

The graphene layer may be a single layer graphene, bilayer graphene or few layer graphene.

The transparent conductor may further comprise a substrate of Hexagonal Boron Nitride or Mica.

The permanent dipole layer may be substantially transparent.

The transmittance may be between 90-98%.

The Young's modulus may be between 4 Gpa and 1 Tpa.

The transparent conductor may be wafer scale or large scale.

The wafer scale or large scale transparent conductor may be between 1 $mm^2$ to 10 $m^2$ in area.

The sheet resistance per sheet may be less than 125Ω/□ at transparency of >97%.

The sheet resistance may be substantially 10Ω/□ at transparency of >90%.

The permanent dipole layer may alternatively be a self assembling molecule layer.

The permanent dipole layer may be substantially polarised and substantially maintains its dipole orientations without any substantial applied electric field.

The transparent conductor may be substantially flexible.

The flexibility may comprise that the original resistance state can be recovered after 20% tensile strain or 6% stretching force.

The transparent conductor may alternatively be substantially non-flexible.

In a second specific expression of the invention there is provided a solar cell, organic light emitting diode, touch panel or display comprising a transparent conductor sheet according to any paragraph above configured as an electrode and/or a diffusion barrier.

In a third specific expression of the invention there is provided a method of fabricating a transparent conductor comprising forming a wafer or sheet of graphene, and electrostatically doping the graphene with a layer of permanent dipoles.

Doping may comprise forming a layer of polarisable material onto the graphene wafer.

The method may further comprise substantially polarising the layer of polarisable material.

The polarising may comprise applying a voltage pulse to, or corona polling, the polarisable material.

Doping may alternatively comprise forming a layer of self-assembled molecules (SAM) on the graphene layer.

The method may further comprise forming the graphene by CVD on copper, epitaxial growth or chemically modifying graphene.

The method may be in a roll to roll process.

BRIEF DESCRIPTION OF THE DRAWINGS

In order that the invention may be fully understood and readily put into practical effect there shall now be described by way of non-limitative example only, an example embodiment described below with reference to the accompanying illustrative drawings in which:

FIGS. 2(a) to 2(d) are cross sections of various embodiments of graphene-ferroelectric devices according to the present invention.

DETAILED DESCRIPTION

Figure 1:
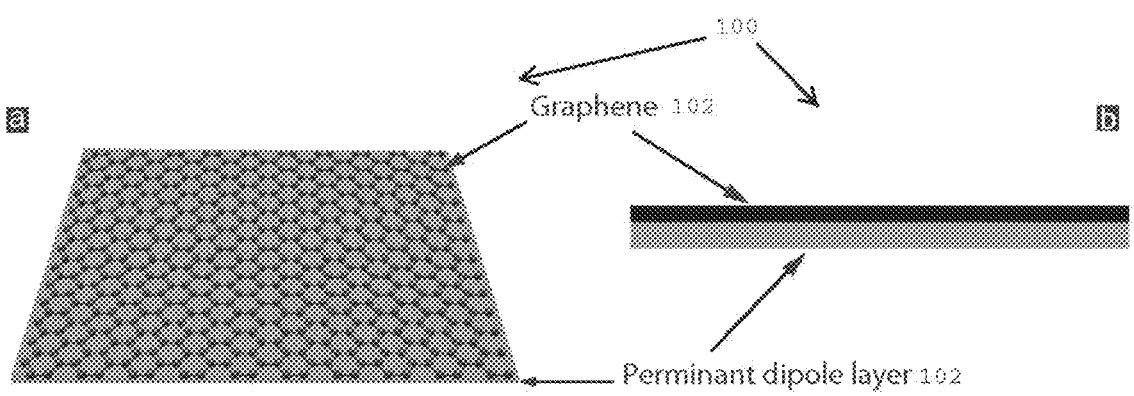
FIG. 1 shows the diagram of a graphene-permanent dipole layer (PDL) hybrid structure as a transparent conductor.

In FIGS. 1(a) and 1(b) a transparent conductor using graphene-permanent dipole layer hybrid structure is illustrated. The graphene layer is the working media for flexible transparent conductor, while the permanent dipole layer (PDL) provides non-volatile high doping of the graphene, without comprising the high optical transparency. The PDL also simultaneously functions as a flexible mechanical supporting layer for the graphene. Preserving the flexibility of graphene is important as it allows the transparent conductor to be fabricated using roll to roll processing and to be used in a wider range of applications.

Referring to FIGS. 2(a) to 2(d), embodiments of the transparent conductor sheet 100 are shown. The transparent conductor sheet 100 includes a graphene layer 102 and a permanent dipole layer 104 on the graphene layer 102. Depending on the application the permanent dipole layer 104 may be under or over the graphene layer 102 or sandwiched on either side.

In FIG. 2(a) a solar cell 106 is shown. The cell 106 includes a gated transparent conductor electrode 100 covering a p layer 108, an intrinsic layer 110 and n layer 112 and a back reflector electrode 114. Typically the cell 106 requires sheet resistance of <10Ω/☐ and transparency of >90%. Thus the configuration of graphene layer 102, the type of permanent dipole layer 104 and the fabrication technique can be modified to achieve those cell characteristics.

In FIG. 2(b) a touch screen 116 is shown. The screen 116 includes a gated transparent conductor electrode 100 covering a capacitive or resistive sensing circuit 118, a glass/polymer substrate 120 and a liquid crystal display 122. Typically the screen 116 requires sheet resistance of 500-2 k Ω/☐ and transparency of >90%. Thus the configuration of graphene layer 102 the type of permanent dipole layer 104 and the fabrication technique can be modified to achieve those screen characteristics.

In FIG. 2(c) an organic light emitting diode OLED 126 is shown. The OLED 126 includes a cathode 128 covering organic light emitting layers 130,132 and a gated transparent conductor electrode 100. Typically the OLED 126 requires sheet resistance of <20Ω/☐ and transparency of >90%. Thus the configuration of graphene layer 102 the type of permanent dipole layer 104 and the fabrication technique can be modified to achieve those OLED characteristics.

In FIG. 2(d) a smart window 136 is shown. A flexible transparent polymer support 138 covers a polymer-dispersed liquid crystal layer 140 and a gated transparent conductor electrode 100. Typically the window 136 requires sheet resistance of 100-1 k Ω/☐ and transparency of 60-90%. Thus the configuration of graphene layer 102 the type of permanent dipole layer 104 and the fabrication technique can be modified to achieve those window characteristics.

Flexibility, Foldability and Stretchablility

The graphene-Permanent Dipole Layer hybrid structure may also have excellent flexibility, foldability and stretchability. For pure graphene, the original resistance state can be recovered even after 20% tensile strain or 6% stretching force are applied. Thus this is desirable for the photovoltaic applications, such as displays, solar cell etc.

Graphene Layer

The graphene layer 102 may be single layer graphene SLG, bilayer graphene BLG or few layer graphene FLG. The graphene layer can also be functionalized graphene or graphene encapsulated with ultrathin flat insulator layer, i.e., h-BN layer. Or graphene may be combined with one layer of BN. A large scale or wafer scale graphene sheet is typically between 1 mm$^2$ to 1 m$^2$.

Permanent Dipole Layer

The permanent dipole layer 104 may be formed from polar molecules or ions with permanent electric dipole orientation, either beneath or above the graphene. For example:

Permanent dipoles arranged in a sheet form such as fully hydrogenated graphene or fluorinated-graphene; or graphene which is hydrogenated on one side and hydrogenated in the other side;

Permanent dipoles arranged in a line form;

Permanent dipoles arranged in a point form; (such as self-assembled molecules (SAM)]

Ferroelectric dielectrics, for example:

Organic ferroelectric polymers (PVDF and its derivatives, such as PVDF-TrFE, VDF oligomer)

Single-component (polar) organic molecules such as Thiourea, TTF-CA;

H-bonded supramolecules Such as Phz-H2ca, Phz-H2ba;

Organic-inorganic compounds such as Rochelle salt, TGS

Inorganic ferroelectric such as KH 2PO4 (KDP, lead zirconate titanate (PZT), BiFeO3, BaTiO3 etc.)

Permanent Dipole Doping

Figure 3:
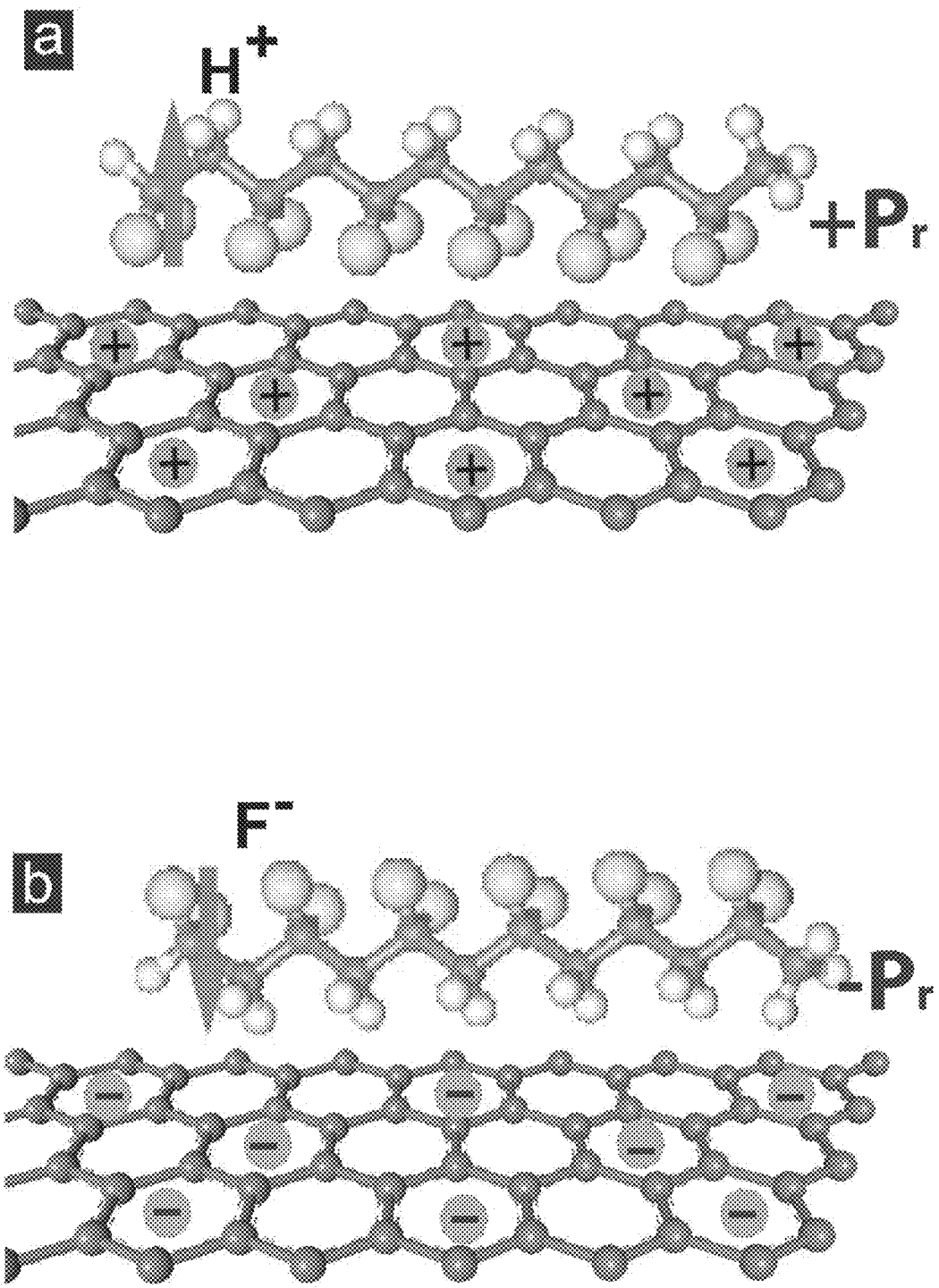
FIGS. 3(a) and 3(b) are chemical structure diagrams of doping graphene using a permanent dipole layer (PDL).

FIG. 3 shows a diagram of electrostatic doping graphene using a permanent dipole layer (PDL). Here, the permanent dipole layer is ferroelectric polymer (P(VDF-TrFE)) as an example. By tuning the permanent dipole orientation in P(VDF-TrFE) through an external electric field, the large-scale graphene can be heavily electrostatically doped by the well aligned dipoles, thus providing a low sheet resistance value. Beyond low sheet resistance, the heavily doped graphene layer can be either p-type or n-type, depending on the polarity of PDL. Such simple and elegant work function tunability of graphene is highly desirable for solar cell and light emitting diode applications, where the efficiency of these multilayer stacked devices is largely determined via the reducing the potential barriers through proper band alignment.

Low Sheet Resistance

Figure 4:
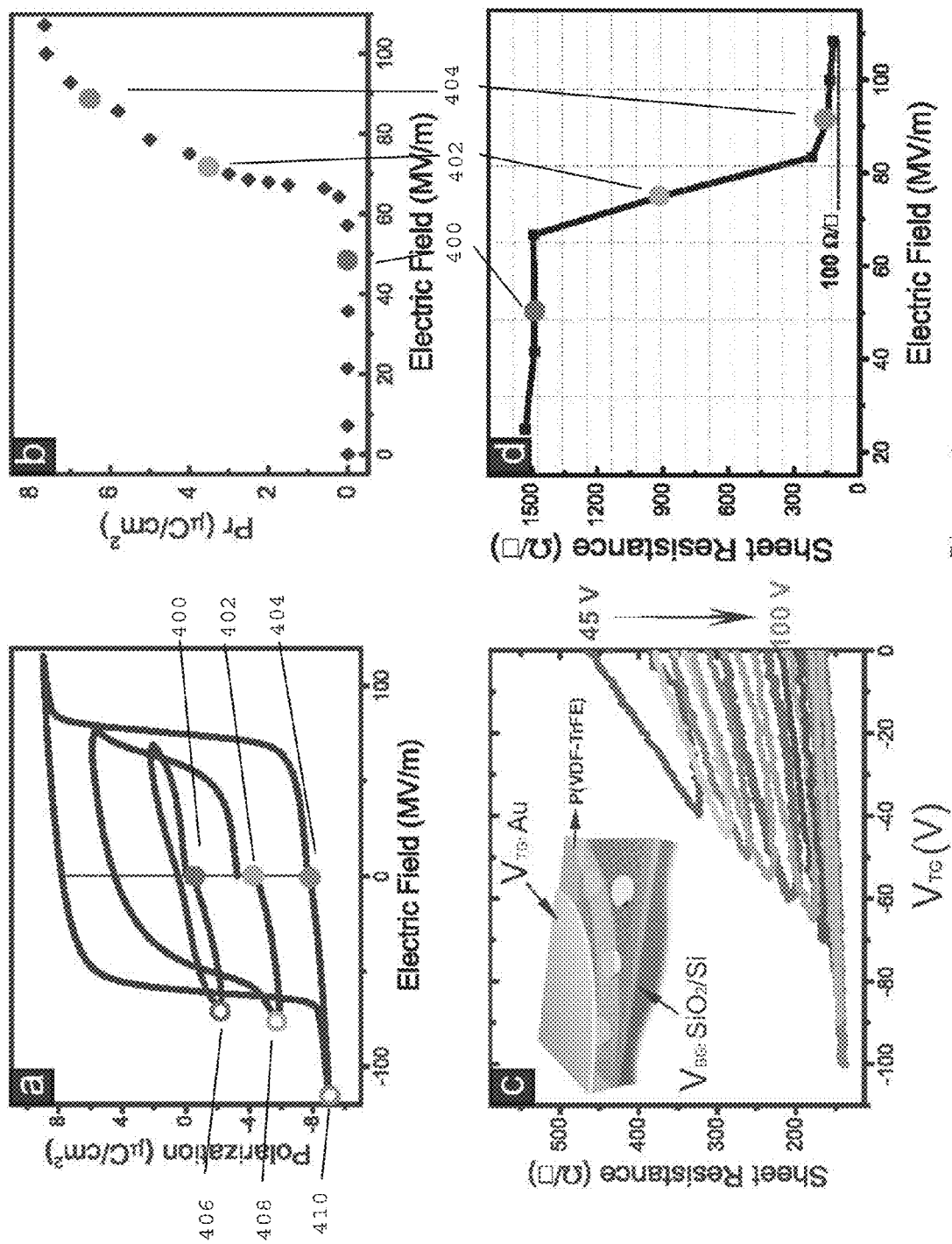
FIGS. 4(a) to 4(d) are graphs showing the relationship between polarization and sheet resistance.

FIG. 4 shows the experimental results of low sheet resistance in large-scale graphene by introducing PDL using P(VDF-TrFE) thin film. FIG. 4(a) shows the typical hysteresis polarization loops of P(VDF-TrFE) thin film as a function of the applied electric field. The loops are generated as a result of increasing applied voltage and therefore increasing electric field. The key parameters relating to the value of sheet resistance are the so-called spontaneous polarization ($P_s$) and remnant polarization ($P_r$). The solid balls represent low 400, medium 402 and high 404 levels of $P_r$. The hollow balls represent low 406, medium 408 and high 408 levels of $P_s$. $P_r$ is specifically shown as a function of the electric field in FIG. 4(b). With hole doping, it is seen that both $-P_s$ and $-P_r$ increase and finally saturates with increasing applied electric field. This $-P_r$ (or $-P_s$) directly determines the electrostatic doping level in graphene by $n_{(VP(VDF\text{-}TrFE))}=\beta P_r/e$ (or $n_{(VP(VDF\text{-}TrFE))}=\beta P_s/e$). FIG. 4(c) shows the systematic gate sweeping of sheet resistance ($R_S$) as a function of $-P_s$. Considering that the conductance of graphene is $\sigma=n_{(VP(VDF\text{-}TrFE))}e\mu$, the corresponding $R_S$ exhibits an inverse relationship with $-P_r$, as shown in FIG. 4(d). Compared to the un-polarized case, 12 times reduction of $R_S$ is achieved when P(VDF-TrFE) is fully polarized, producing 120Ω/□ low sheet resistance for single layer graphene. Note that an even lower sheet resistance could be achievable at $-P_s$. However, this is of little practical value since a constant voltage needs to be applied. After the P(VDF-TrFE) is fully polarized, the induced non-volatile doping maintains the low sheet resistance of large-scale graphene even if the power is turned off.

Light Transmittance

Figure 5:
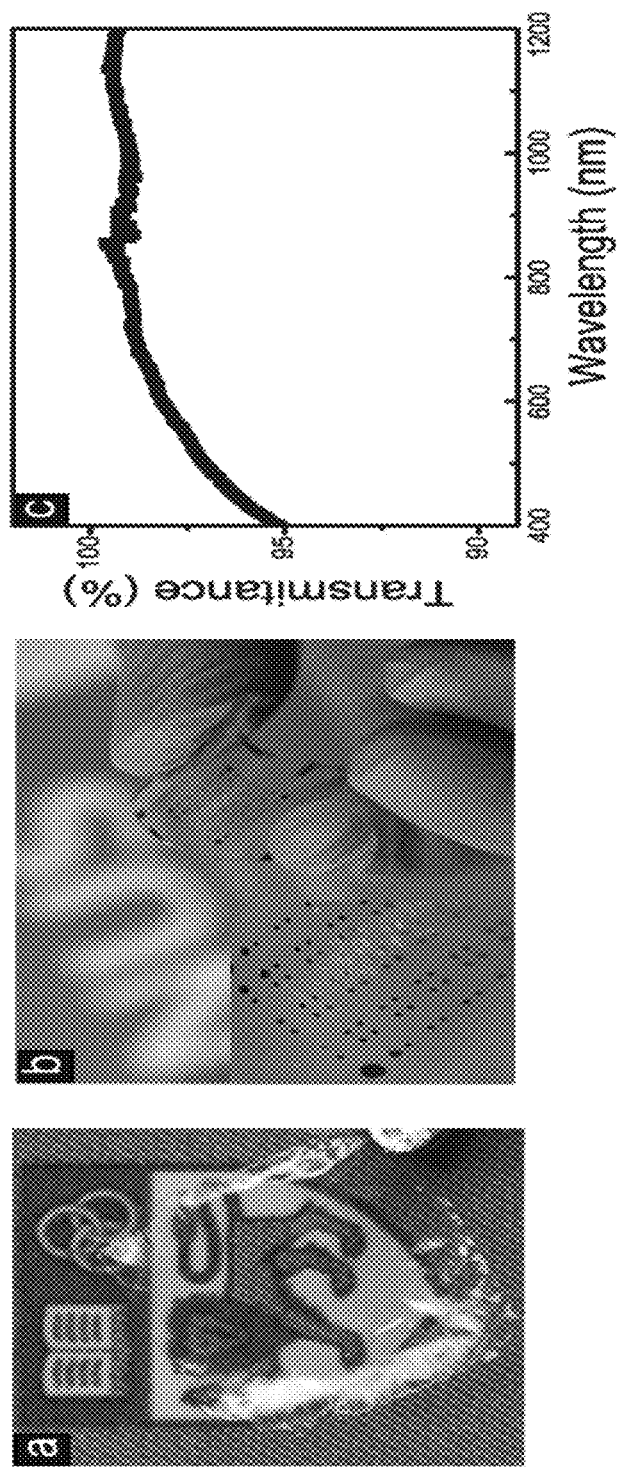
FIGS. 5(a) to 5(c) show the transparency of the Freestanding of graphene-P(VDF-TrFE) hybrid structure.

Besides low sheet resistance, high optical transparency may be useful in applications of transparent electrodes in optoelectronics. The graphene-P(VDF-TrFE) hybrid structure for optical experiments is shown in FIG. 5. The P(VDF-TrFE) film used here is 1 μm thickness, which may provide mechanical support for graphene, as shown in FIG. 5(a) against the background of the National University of Singapore logo. FIG. 5(b) shows the graphene-P(VDF-TrFE) hybrid structure on flexible PET substrate, showing the flexibility of the device. The transmission spectrums of hybrid graphene-P(VDF-TrFE) device as a function of wavelength from the visible to near IR are further recorded, as shown in FIG. 5(c). At visible wavelength regime, the optical transparency of graphene-P(VDF-TrFE) hybrid structure is more than 95%.

Sub-10Ω/□ Sheet Resistance

Figure 6:
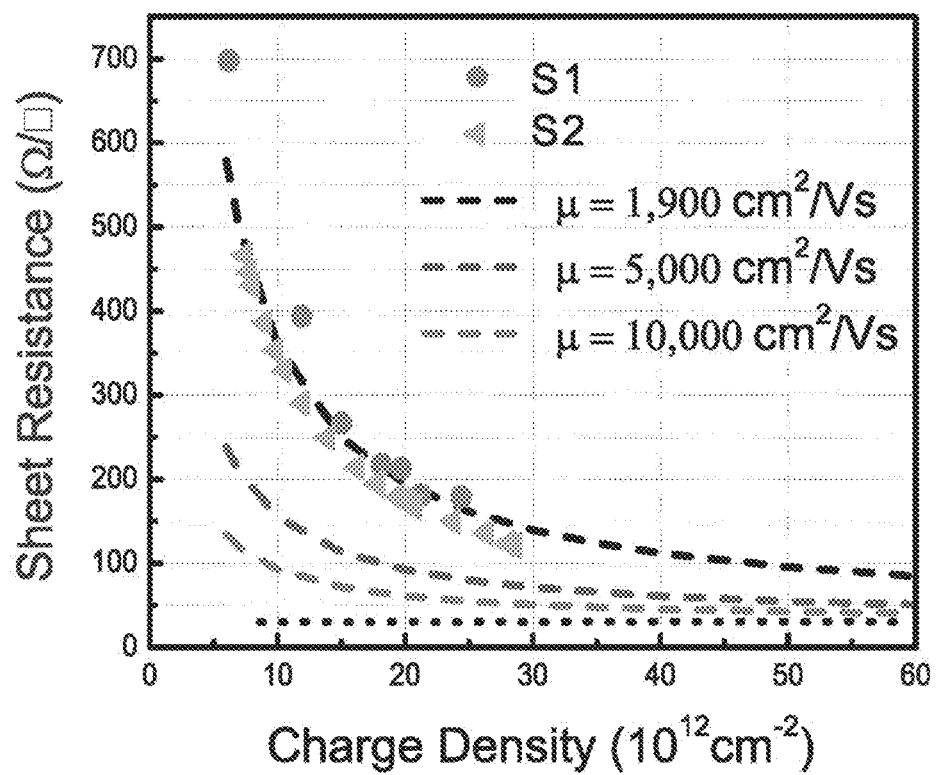
FIG. 6 is a graph of sheet resistance at different charge carrier mobility and carrier density.

In some applications, a 120Ω/□ sheet resistance value maybe still be too high. In order to find out the limiting factor and achieve sub-10Ω/□ sheet resistance in large-scale graphene, the underlying charge carrier scattering mechanism was analysed. FIG. 6 shows both the experimental results with theoretical estimation of the sheet resistance of graphene at different charge carrier mobility and carrier density. The sheet resistance is limited to be 30Ω/□ even if carrier mobility is enhanced to be 10,000 cm$^2$/Vs or beyond. This is due to the intrinsic acoustic and flexural phonon scattering. For the nanoripple induced flexural phonon scattering, its negative impact can be largely suppressed through electrostatic high doping owing to its reverse relationship with charge density n. When n reaches $5 \times 10^{13}$ cm$^{-2}$, the flexural phonon scattering contributed resistivity is less than 2Ω/□.

For the intrinsic acoustic phonon scattering, the elimination can be achieved by stacking bilayer or few layer graphene together. For example, the acoustic phonon scattering in bilayer graphene is roughly half of single layer graphene, thus making 15Ω/□ sheet resistance and 95% transmittance achievable. For few layer graphene, i.e., 4 layer graphene, its sheet resistance will be much reduced and sub-10Ω/□ with 90% transmittance is expectable.

Fabrication Methods

Figure 7:
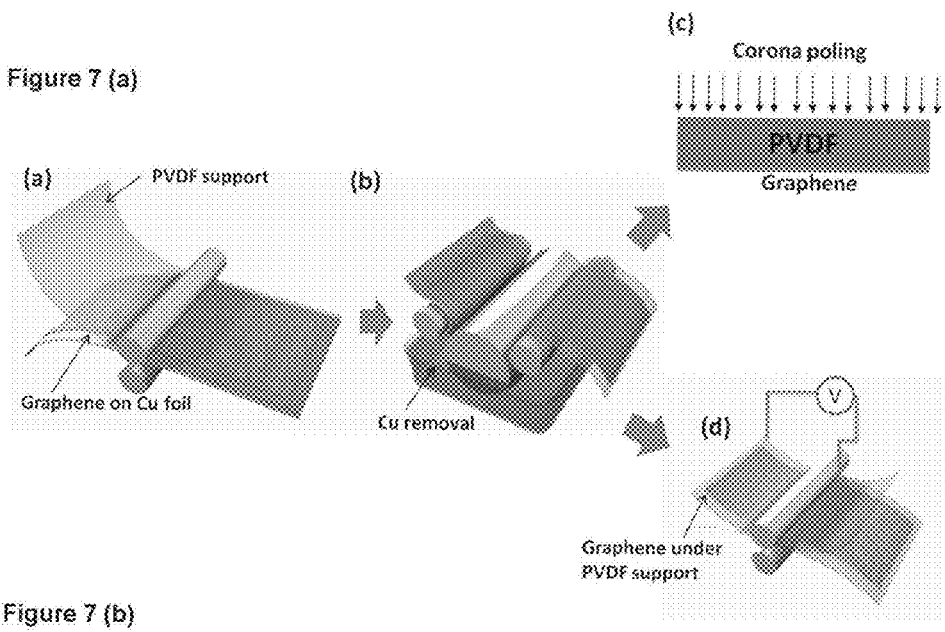
FIGS. 7(a) to 7(c) are schematics of methods of fabrication with the graphene on the ferroelectric polymer.
Figure 7:
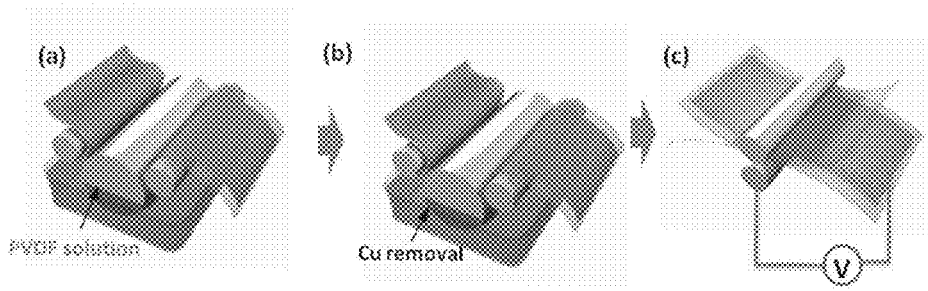
Figure 7:
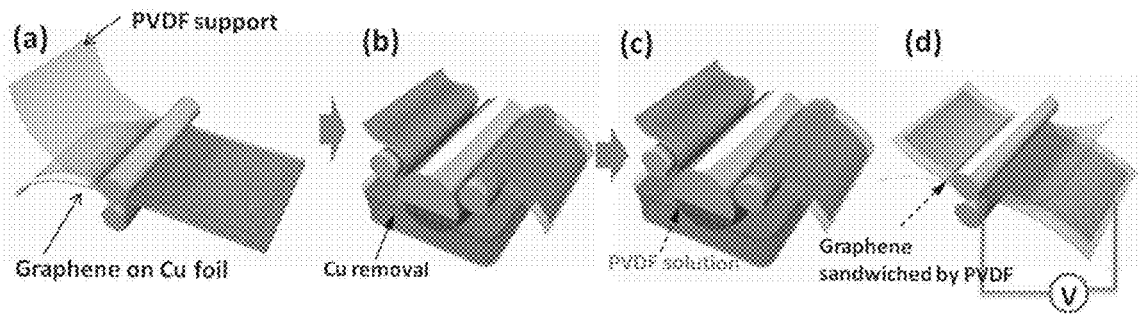

The transparent conductors mentioned can advantageously be fabricated by roll to roll or other continuous processes as shown in FIG. 7.

FIG. 7(a) shows the fabrication of graphene-permanent dipole layer where graphene is underneath permanent dipole layer. The PVDF support is laminated to the graphene on Cu foil (a). Then the copper foil is removed (b). The graphene-permanent dipole layer hybrid can be simultaneously polarized through either the roll-to-roll compatible poling (d) or corona poling (c).

FIG. 7(b) shows the fabrication of graphene-permanent dipole layer where graphene is on top of permanent dipole layer. Firstly a PVDF layer is roll-to-roll coated by passing the graphene on Cu foil through a bath of PVDF solution (a). Then the Cu foil is removed (b). The graphene-permanent dipole layer hybrid is then polarised through roll to roll compatible polling or contact polarization (c).

FIG. 7(c) shows the encapsulated graphene using permanent dipole layers. The PVDF support is laminated to the graphene on Cu foil (a). Then the Cu foil is removed (b). Then a further layer of PVDF is formed by passing the graphene layer through a bath of PVDF solution (c). The sandwiched graphene is then polarised through roll to roll compatible polling (d).

Note that the graphene layer can be formed using a number of methods. For example, Cu-CVD graphene, epitaxial grown graphene, or chemical modified graphene. The ultra low sheet resistance is further enhanced by ultra high charge carrier mobility by transferring or preparing CVD graphene on atomically-flat, ultra-thin substrates. Atomically-flat, ultra-thin substrates may include:

Hexagonal Boron Nitride (hBN)

Mica

Advantages

One or more of the transparent conductors mentioned above may have one or more advantages including:

highly transparency low sheet resistance excellent mechanical supporting layer high efficiency, low power consumption flexible capable of roll to roll fabrication process

The invention claimed is:

1. A transparent conductor comprising:
 a graphene layer, and
 a permanent dipole layer on the graphene layer configured to electrostatically dope the graphene layer, wherein the permanent dipole layer being polarised and which maintains its dipole orientations without any applied electric field, wherein the permanent dipole layer is formed from a material comprising at least one of polar molecules or ions, and wherein the dipoles of the material are aligned to create the polarised permanent dipole layer.

2. The transparent conductor in claim 1 wherein the permanent dipole layer is
 a substantially polarised ferroelectric layer,
 substantially transparent, and/or
 a self assembling molecule layer.

3. The transparent conductor in claim 1 wherein the graphene layer is a single layer graphene, bilayer graphene or few layer graphene.

4. The transparent conductor in claim 1 further comprising an ultrathin layer of Hexagonal Boron Nitride or Mica.

5. The transparent conductor in claim 2 wherein the transmittance is between 90-98%.

6. The transparent conductor in claim 1 wherein the Young's modulus is between 4 Gpa and 1 Tpa.

7. The transparent conductor in claim 1 wherein the transparent conductor is wafer scale or large scale.

8. The transparent conductor in claim 7 where the wafer scale or large scale transparent conductor is between 1 mm² to 10 m² in area.

9. The transparent conductor in claim 1 wherein the sheet resistance is less than 125Ω/□ at transparency of >97%, or substantially 10Ω/□ at transparency of >90%.

10. The transparent conductor in claim 1 which is substantially flexible.

11. The transparent conductor in claim 10 wherein the flexibility comprises that the original resistance state can be recovered after 20% tensile strain or 6% stretching force.

12. The transparent conductor in claim 1 which is substantially non-flexible.

13. A solar cell, organic light emitting diode, touch panel or display comprising a transparent conductor according to claim 1 configured as an electrode and/or a diffusion barrier.

14. A method of fabricating a transparent conductor comprising
 forming a wafer or sheet of graphene,
 electrostatically doping the graphene with a layer of permanent dipoles, the layer being a layer of polarisable material, and
 polarising the layer of polarisable material such that the layer of polarisable material maintains its dipole orientations without any applied electric field.

15. The method in claim 14 wherein the polarising comprises applying a voltage pulse to, or corona polling, the polarisable material.

16. The method in claim 14 wherein doping comprising forming a layer of self-assembled molecules (SAM) on the graphene layer.

17. The method in claim 14 further comprising forming the graphene by CVD on copper, epitaxial growth or chemically modifying graphene.

18. The method in claim 14 in a roll to roll process.

* * * * *